(12) United States Patent
Chaudhari et al.

(10) Patent No.: US 6,774,463 B1
(45) Date of Patent: Aug. 10, 2004

(54) SUPERCONDUCTOR GATE SEMICONDUCTOR CHANNEL FIELD EFFECT TRANSISTOR

(75) Inventors: Praveen Chaudhari, Briarcliff Manor, NY (US); Richard Joseph Gambino, Yorktown Heights, NY (US); Eti Ganin, Peekskill, NY (US); Roger Hilsen Koch, Amawalk, NY (US); Lia Krusin-Elbaum, Dobbs Ferry, NY (US); Robert Benjamin Laibowitz, Reekskill, NY (US); George Anthony Sai-Halasz, Mount Kisco, NY (US); Yuan-Chen Sun, Katonah, NY (US); Matthew Robert Wordeman, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 1826 days.

(21) Appl. No.: 07/842,722

(22) Filed: Feb. 24, 1992

Related U.S. Application Data

(63) Continuation of application No. 07/733,361, filed on Jul. 19, 1991, now abandoned, which is a continuation of application No. 07/473,292, filed on Feb. 1, 1990, now abandoned.

(51) Int. Cl.[7] .............................................. H01L 39/00
(52) U.S. Cl. ........................ 257/663; 505/193; 505/235; 505/873
(58) Field of Search ............................ 257/32, 33, 663; 505/193, 235, 873

(56) References Cited

U.S. PATENT DOCUMENTS

| | | | |
|---|---|---|---|
| 4,496,931 A | 1/1985 | Watanabe et al. | ............. 338/35 |
| 4,575,741 A | 3/1986 | Frank | ............................ 357/6 |
| 4,647,954 A | 3/1987 | Graf et al. | ................. 357/23.3 |
| 4,814,839 A * | 3/1989 | Nishizawa et al. | ........ 357/23.3 |
| 4,837,609 A | 6/1989 | Gurvitch et al. | .............. 357/71 |
| 4,851,895 A | 7/1989 | Green et al. | ................... 357/71 |
| 4,999,337 A * | 3/1991 | Yamada | ......................... 357/5 |
| 5,164,805 A * | 11/1992 | Lee | ............................. 257/351 |

FOREIGN PATENT DOCUMENTS

| | | | |
|---|---|---|---|
| EP | A0331527 | 6/1989 | |
| EP | 0324044 | * 7/1989 | .................... 357/5 |
| EP | 324044 | 7/1989 | .................... 357/5 |
| JP | 63262872 | * 10/1988 | ................. 257/663 |
| JP | 63-292654 | * 11/1988 | ................. 257/663 |
| JP | 1-37056 | * 2/1989 | .................. 257/39 |
| JP | A1074758 | 3/1989 | |
| JP | 64-74758 | * 3/1989 | |
| JP | 1-135080 | * 5/1989 | .................. 257/39 |
| JP | 1-137683 | * 5/1989 | |
| JP | 1170080 | 7/1989 | .................... 357/5 |

OTHER PUBLICATIONS

A. Mogro—Campero, et al. "characterization of Thin Film of XBa–Cu–O as oxidized Silicon with a zirconia Buffer Layer", Appl. Phys. Lett, 52 (24), Jun. 13, 1988, pp. 265–2070.*

Venkatessan et al. "Super Conducting $Y_1Ba_2Cu_3O_{7-x}$ Films on Si", Appl. Phys. Lett. 53 (3), Jul. 18, 1988, pp. 243–245.*

Escher, J.S. "6–Activation Related Studies–III–V's " pp. 224 To 230 Of Text "Semiconductors and SemiMetals"vol. 15 Academic Press. NY. 1981.

(List continued on next page.)

*Primary Examiner*—Allan R. Wilson
(74) *Attorney, Agent, or Firm*—Daniel P. Morris; Alvin J. Riddles

(57) ABSTRACT

In a Field Effect Transistor (FET) with a semiconductor channel the use of a high $T_c$ oxide superconductor material in the gate electrode provides both control of parasitic resistance and capacitance and a proper work function when operated at a temperature below the $T_c$. The 1-2-3 compound oxide superconductors with the general formula $Y_1Ba_2Cu_3O_{7-y}$ where y is approximately 0.1 have the ability in use in FET's to provide convenient work functions, low resistance and capacitance, and to withstand temperatures encountered in processing as the FET is being manufactured.

1 Claim, 1 Drawing Sheet

OTHER PUBLICATIONS

"High $T_c$ Bismuth and Thallium Copper Oxide Superconductors" by Sleight et al, materials Research Society, MRS Bulletin, vol. XIV, No. 1, Jan. 1989, p. 45–48.

"High $T_c$ Superconducting Thin Films"by R.B. Laibowitz, Materials Research Society, MRS Bulletin, vol. XIV, No. 1, Jan. 1989, pp. 58–62.

"Relation Between an Atomic Electronegativity Scale and the Work Function" by H.B. Michaelson, IBM Journal of Research and Development, vol. 22, No. 1, Jan. 1978, pp. 72–80.

"Effect of Interconnection Delay on Liquid Nitrogen Temperature CMOS Circuit Performance" by Watt et al, Institute of Electrical and Electronic Engineers–IEDM Proceedings, 1987, pp. 393–396.

"8.6ps/Gate Chilled Si E/E NMOS Integrated Circuit" by Kobayashi et al, Institute of Electrical and Electronic Engineers–IEDM Proceedings, 1988, pp. 881–882.

Harper et al, "Mechanisms for Success or Failure of Diffusion Barriers Between Aluminum & Silicon" Journal Vacuum Sci & Tech A vol. 7, No. 3 May 1989 p 875–880.

Jia et al, "Sputter Deposition of $YBa_2Cu_3O_{7-x}$ Films on Si at 500 Degrees C with Conducting Metallic Oxide as Buffer Layer" Applied Physic Letters 57 Jul. 16, (1990) No. 3, New York, US.

Berberich et al. "Low–Temperature Preparation of Super Conducting $YBa_2Cu_3Cu_3O_{7-\delta}$Films on Si, MgO and $SrTiO_3$ by Thermal Coevaporation" Appl. Phys Lett. 53 (10) Sep. 5, 1988 pp. 925–926.

J.Y C–Sun et al. "Submicrometer–Channel CMOS for Low–Temperature Operation" IEEE Transactions on Electron Devices vol. ED–34 No. 1, Jan. 87 P19–27.

Divari et al "Submicron Tungsten Gate MOSFET With 10 NM Gate Oxide" 1987 Symp. on VLSI Technolgy. Dis. of Tech Papers 1987 pp. 61–62.

D.K Lathrop et al. "Production of $YBa_2Cu_3O_{7-\gamma}$Superconducting Thin Films Insitu by High Pressure Reactive Evaporation and Rapid Thermal Annealing" Appl. Phys. Lett. 51 (19) Nov. 9, 1989. pp. 1554–1556.

Adachi et al. "Low–Temperature Process for the Preparation of High Tc Superconducting Thin Films" Appl. Phys. Lett. 51 (26) Dec. 28, 1987 pp. 2263–2265.

Wu et al. "Low–Temperature Preparation of High Tc Superconducting Thin Films" Appl. Phys. Lett. 52 (9) Feb. 29, 1988 pp. 754–756.

A. Mogro–Campero et al. "Thin Films of YBaCuO on Silicon and Silicon Dioxide" Appl. Phys. Lett. vol 52 No 14 Apr. 4, 1988 pp. 1185–1186.

Lee et al. "High Tc $YBa_2Cu_3O_{7-x}$ Thin Films on Si substrates by DC Magnetron Sputtering From a Stoichiometric Oxide Target" Appl. Phys. Lett. vol 52 No. 26 Jun. 27, 1988, pp. 2263–2265.

Witanachchi et al. "Deposition of Superconducting YBaCuO Films at 400° C. Without Post Annealing" Appl. Phys. Lett. 53 (3) Jul. 18, 1988 pp. 234–236.

Laibowitz (Jan. 1989) "High Tc Superconducting Thin Films" Materials Research Society (MRS) Bulletin, vol. XIV No. 1, pp. 58–62.

Sleight et al (Jan. 1989) "High Tc Bismuth and Thallium Cu O Superconductors"MRS Bulleting vol. XIV No. 1, pp. 45–48.

S.J. Hillenius et al. "A Symmetric Submicron CMOS Technology" IEEE—IEDM 86 pp. 252–255.

IBM Technical Disclosure Bulletin vol. 31 No. 3 Aug. 88 pp. 46–47 "Method for Producing MDS Devices with Particular Thresholds by Providing Mixer Metal Gate Electrodes."

D.K Lathrop et al. "Production of $YBa_2Cu_3O_{7-\gamma}$Superconducting Thin Films Insitu by High Pressure Reactive Evaporation and Rapid Thermal Annealing" Appl. Phys. Lett. 51 (19) Nov. 9, 1989. pp. 1554–1556.

Adachi et al. "Low–Temperature Process for the Preparation of High Tc Superconducting Thin Films" Appl. Phys. Lett. 51 (26) Dec. 28, 1987 pp. 2263–2265.

Wu et al. "Low–Temperature Preparation of High Tc Superconducting Thin Films" Appl. Phys. Lett. 52 (9) Feb. 29, 1988 pp. 754–756.

J.Y C–Sun et al. "Submicrometer–Channel CMOS for Low–Temperature Operation" IEEE Transactions on Electron Devices vol. ED–34 No. 1, Jan. 87 P19–27.

Divari et al "Submicron Tungsten Gate MOSFET With 10 NM Gate Oxide" 1987 Symp. on VLSI Technolgy. Dis. of Tech Papers 1987 pp. 61–62.

A. Mogro–Campero et al. "Thin Films of YBaCuO on Silicon and Silicon Dioxide" Appl. Phys. Lett. vol 52 No 14 Apr. 4, 1988 pp. 1185–1186.

Lee et al. "High Tc $YBa_2Cu_3O_{7-x}$ Thin Films on Si substrates by DC Magnetron Sputtering From a Stoichiometric Oxide Target" Appl. Phys. Lett. vol 52 No. 26 Jun. 27, 1988, pp. 2263–2265.

Witanachchi et al. "Deposition of Superconducting YBaCuO Films at 400° C. Without Post Annealing" Appl. Phys. Lett. 53 (3) Jul. 18, 1988 pp. 234–236.

* cited by examiner

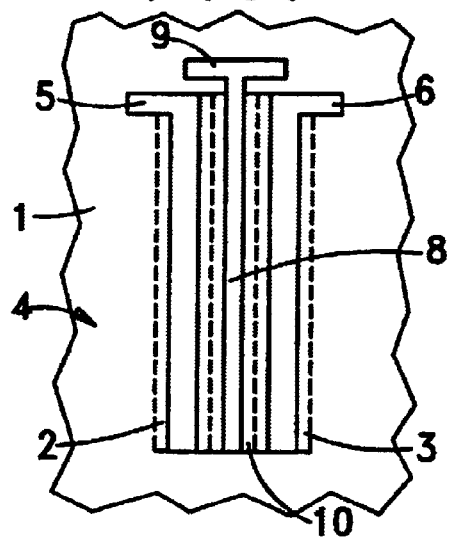
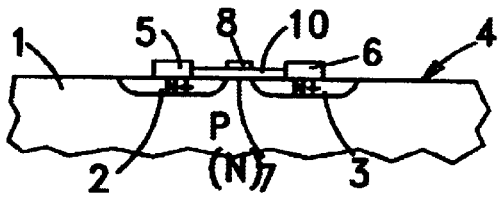
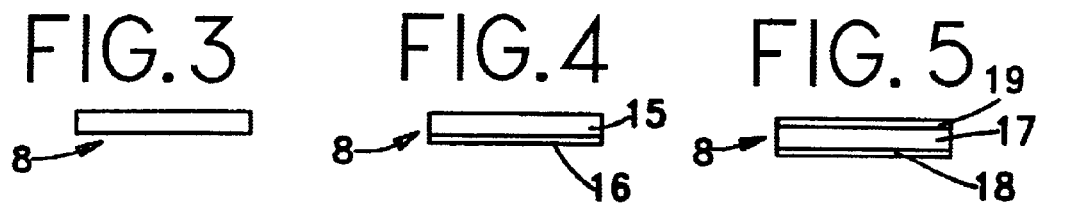
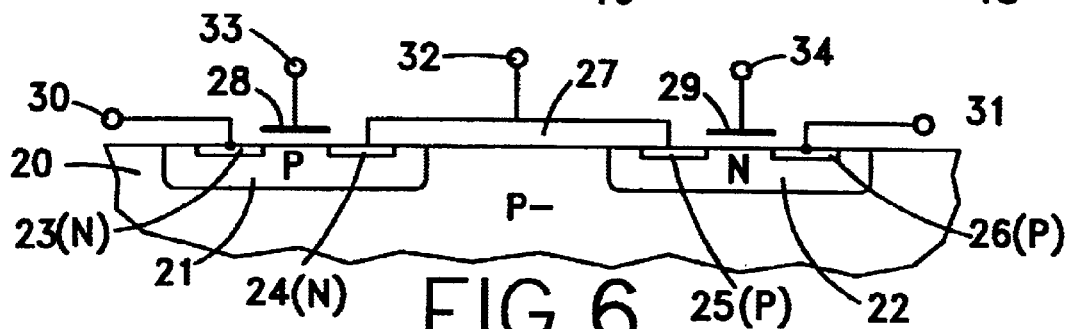
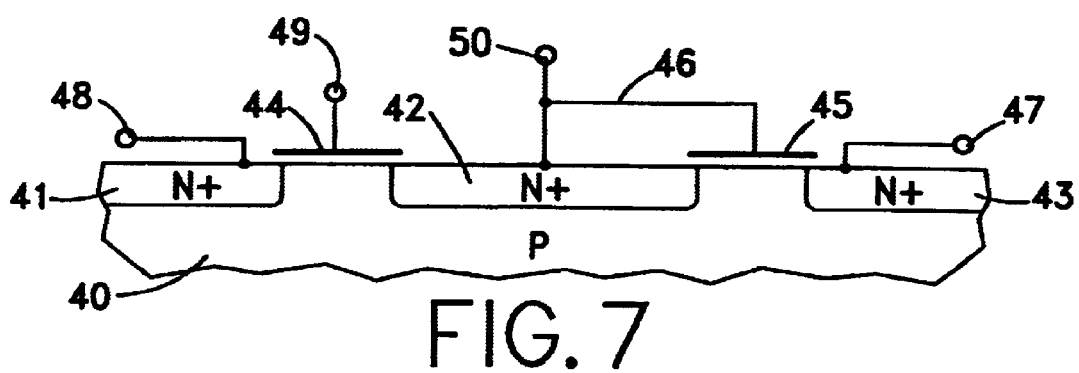

SUPERCONDUCTOR GATE SEMICONDUCTOR CHANNEL FIELD EFFECT TRANSISTOR

This application is a continuation of application Ser. No. 07/733,361 filed Jul. 19, 1991, now abandoned, which in turn was a continuation of application Ser. No. 07/473,292 filed Feb. 1, 1990, now abandoned.

CROSS REFERENCE TO OTHER APPLICATIONS

Reference is made to copending application entitled Semiconductor Superconductor Integrated Circuit Technology filed contemporaneously herewith as application Serial No. 07/473,483 filed Feb. 01, 1990.

TECHNICAL FIELD

The invention relates to field effect transistors of the type wherein the conductivity of a channel in a semiconductor body is affected by a charge on a gate positioned adjacent to that channel and to the improvement in circuit performance thereof through employing a high temperature superconductor material in the gate.

BACKGROUND OF THE INVENTION

In the technology involving field effect transistors, as packing density and performance demands increase, the detracting effects of resistance and capacitance parasitics are being found to be serious in the type of field effect transistor (FET) having a metal or polysilicon gate. At the smallest dimensions, a quarter micron and smaller, the gate resistance becomes a serious detractor due to the RC time constant of the gate. In the metal-silicide gate FET, at small dimensions, the work function of typical metals limits performance. The choice of materials that can be employed in the gate is limited by requirements forced by the work function and compatibility with the processing techniques used in very large scale integrated circuits. It is also known that there are advantages in lower temperature of the order of 77° K. operation and, in fact, it is accepted that there is about a 30% performance increase in the devices themselves. Further, with low temperatures, lower noise margins are encountered and lower voltages may be used.

SUMMARY OF THE INVENTION

The use of an oxide or ceramic superconductor material that is in the superconducting state in the gate of semiconductor channel FET provides improved performances through practical elimination of the RC time constant of the gate and the providing of a work function that allows convenient threshold control. In depletion mode FET devices, the proper work function permits operation at 77° K. Oxide or ceramic superconductor materials are compatible with standard integrated circuit processing techniques and temperatures.

BRIEF DESCRIPTION OF THE DRAWINGS

FIG. 1 is a top view of the superconductor gate semiconductor channel field effect transistor of the invention.

FIG. 2 is a cross sectional view of the superconductor gate semiconductor channel field effect transistor of the invention.

FIGS. 3, 4 and 5 are cross sectional views of FET gate structures with different properties employed in the invention.

FIG. 6 is a cross-sectional view of a CMOS structure employing the invention.

FIG. 7 is a cross section of an enhancement-depletion (E/D) FET structure employing the invention.

BEST MODE DESCRIPTION OF THE INVENTION

Referring to FIG. 1, in a top view, a field effect transistor (FET) is positioned in a semiconductor substrate 1 of, for example, p conductivity type silicon. A source 2 and a drain 3 N$^+$ conductivity type electrodes are positioned in a surface 4 of the substrate 1, with the high doping shown in dotted outline and the contacts thereto shown as 5 and 6, respectively. The area between the source 2 and the drain 3 is the channel 7. In the narrow space between the source 2 and the drain 3, a gate 8 extending to a contact 9 is positioned over a gate insulator 10 that in turn is over the channel 7. In this type of structure, the RC time constant of the long narrow gate 8 is a serious detractor to performance.

In accordance with the invention, the gate 8 is of superconductor material that is superconductive at the temperature of operation.

Referring to FIG. 2, in a cross sectional view, in the substrate 1, the source 2 and drain 3 high conductivity N$^+$ regions are in the substrate 1 with the contacts 5 and 6 extending above. The channel 7 is in the substrate 1 between the source 2 and the drain 3. The superconductor gate 8 is positioned between the source 2 and drain 3 separated from the channel 7 by the gate insulator 10.

In operation, a charge on the gate 8 operates to change the current flowing between the source 2 and the drain 3.

In accordance with the invention, the gate 8 contains an oxide superconducting material that is in the superconducting state. The gate 8 may be all oxide superconductor as shown in FIG. 3, have a combination oxide superconductor layer 15 and a polysilicon layer 16 for enlarged process window advantages and special gate work function properties as shown in FIG. 4 and the gate 8 may have a layer 17 of an oxide superconductor between layers 18 and 19 of a material selected for further work function adjustment as shown in FIG. 5.

The purpose of the structures of FIGS. 4 and 5 is to facilitate device threshold adjustment. The superconducting material has the well known property of zero resistance with accompanying low parasitic capacitance resulting from small cross sectional area made possible by the high conductance. These features allow small interelectrode separation and correspondingly high density. Further, since the oxide superconductor has ceramic properties, it is rendered superconducting by a firing or deposition step at greater than approximately 650° C. and, thereafter, will withstand prolonged high temperatures. This results in a broad "process window" or temperature cycle production tolerance so that it can be applied early in the manufacturing operation and not be influenced by later processing events.

The most studied oxide superconducting material is a class of compounds known in the art as 1-2-3 compounds with the general formula $Y_1Ba_2Cu_3O_{7-y}$ where y is approximately 0.1, which have transition temperatures to the superconducting state as high as 94° K. The transition temperature can be maintained where the yttrium (Y) is replaced by such rare earths as europium, gadolinium, neodymium, etc.

There are families of other compounds, for example, one of bismuth, strontium, calcium, copper and oxygen with a transition temperature of approximately 108° K.; another of thallium, strontium, calcium, copper and oxygen with a transition temperature of approximately 125° K. and still another of lanthanum, strontium, copper and oxygen with a transition temperature of approximately 37° K. A discussion of families of superconducting compounds is presented in the Materials Research Society, MRS Bulletin, Volume XIV, No. 1, January 1989, pages 45 to 48.

The oxide superconductor material may be applied by a variety of vapor deposition techniques. Examples of these techniques are discussed in Materials Research Society, MRS Bulletin, Volume XIV, No. 1, January 1989, pages 58–62.

A valuable feature of the oxide superconductor is the work function which is the energy required to remove an electron from the material.

In general, a combination of materials with different work functions result in a work function within the range defined by the extreme work functions of the constituents. For example, for the 1-2-3 compound of $Y_1Ba_2Cu_3O_{7-y}$, the $Y_2O_3$ constituent exhibits a work function of about 2 eV, the BaO constituent exhibits a work function of about 1.6 eV and the CuO constituent exhibits a work function of about 4.1 eV so that the work function would be expected to be higher than about 1.6 eV and lower than about 4.1 eV.

It has also been shown that there is a relationship between electronegativity and work function. There is a discussion in the IBM Journal of Research and Development, Vol. 22, No. 1, January 1978, pages 72–80.

The principles of the invention are useful for enhancement mode devices, for N conductivity type channel (NMOS) devices, for P conductivity type (PMOS) devices and for complementary n and p (CMOS) type circuits. It is also useful for N and P conductivity type depletion mode devices. In many structures, more than one type device is included in the same substrate.

It is desirable to have the threshold voltage of a depletion mode FET with an n-channel to be negative. Where the work function of the gate is large, of the order of 4.0 eV, as occurs with a metal gate such as Al or with n doped polysilicon it is necessary to counterdope the channel region 7 to cause the threshold voltage to be negative. Such structures, however, at 77° K. or lower, do not operate properly due to carrier freezeout in the counterdoped channel region which in turn causes a shift in threshold or turn off voltage in the device.

It will be apparent to one skilled in the art that for a depletion mode p channel, the channel will be doped p and a high work function gate employed. The higher work function can be achieved by the type of gate structure of FIG. 5.

The combination of the gate 8 of the oxide superconductor with work function control materials provides more precise threshold for turn-on resulting in reduced delays and better sub-threshold behavior in normally off devices.

In FIG. 4, the gate 8 is made up of a layer 15 of oxide superconductor and a layer 16 of polysilicon that is thin and conducting, and of the proper conductivity type. The layer 16 can be as thin as 2 nanometers.

The layer 15 of oxide superconductor is blanket deposited with minimum thickness sufficient to cover and generally is greater than 10 nanometers. The resulting gate structure has the precise work function of the polysilicon for threshold signal level control while also having the benefits of the low resistance of the oxide superconductor.

In FIG. 5, further control of gate work function is illustrated. In FIG. 5, the gate 8 is made up of a layer 17 of oxide superconductor between a lower electrode layer 18 of a conducting oxide, such as ruthenium dioxide ($RuO_2$), that has a work function in the 4.6 to 8.0 eV range, about mid bandgap of the Si semiconductor 1 and a covering electrode layer 19 is which may be of the same material. The lower electrode layer 18 is positioned on the insulating oxide layer 10. The $RuO_2$ is stable, is a good conductor with a resistivity about 30 micro ohm-centimeter. It is an excellent diffusion barrier. The $RuO_2$ may be annealed in oxygen and does not degrade.

The structure of FIG. 5 may be prepared by sputtering a 5 to 50 nanometer thick layer 18 of $RuO_2$ on the gate insulator 10, followed by a 150–300 nanometer thick layer of oxide superconductor 17. Patterning of the gate can be performed using, for example, $HNO_3$:$H_2O$ (3:7) solution as a chemical etch, or by ion milling. A capping layer 19 of, for example, 5–50 nanometers thick $RuO_2$ can also be added by depositing on the layer 17. Layer 19 provides electrical contact to, as well as environmental protection and stability for, the oxide superconductor 17.

The principles of the invention in gate work function adjustability are particularly useful in FET structures where devices are in a common substrate. The superconductor favorable work function may be used alone, adjusted, combined with channel doping or used to eliminate the need for some types of channel doping in these structures in operation mode and threshold selection.

Referring next to FIG. 6, an illustration of the invention is shown applied to one example of the CMOS type structure. In FIG. 6, the CMOS structure is made in a substrate 20 of, for example, p⁻ conductivity type silicon in which two p and n conductivity type wells 21 and 22, respectively, are positioned. In well 21, N⁺ source 23 and drain 24 electrodes are positioned. Correspondingly, in well 22, P⁺source 25 and drain 26 electrodes are positioned. The elements 24 and 25 are electrically joined by element 27. A superconducting gate 28 is provided for the device in well 21 and a superconducting gate 29 is provided for the device in well 22. A conductor 30 serves as a power connection, a conductor 31 serves as a ground or reference connection, the output is at terminal 32 connected to element 27 and the inputs are at terminals 33 and 34 connected to gates 28 and 29, respectively. The superconducting gates 28 and 29 have resistance, capacitance and work function benefits as described in connection with FIGS. 3, 4 and 5.

Referring n to FIG. 7, an illustration of the invention as applied to an enhanced-depletion (E/D) FET circuit structure is shown. In FIG. 7, the structure is made in a substrate 40 of, for example, p conductivity type silicon having three N⁺ conductivity type electrodes 41, 42 and 43, respectively, in one surface. The electrode 42 serves as a common electrode separated by a channel from electrode 41 on one side and another channel from electrode 43 on the other side. A first superconductor gate 44 is positioned over the channel between electrodes 41 and 42 and a second superconductor gate 45 is positioned over the channel between electrodes 42 and 43. The electrode 42 and the gate 45 are electrically joined by conductor 46. A conductor 47 serves as a power connection, a conductor 48 serves as a ground connection, a terminal 49 connected to the first gate 44 serves as the input and the terminal 50 connected to element 46 serves as the output. In the structure of FIG. 7, the gates have the resistance, capacitance and work function benefits as described in connection with FIGS. 3, 4 and 5. In E/D devices, such as that of FIG. 7, the favorable work function of the superconductive gate of the invention makes possible a naturally negative threshold level for one device while using standard techniques to establish a precise turn-on level for the other device and also makes possible eliminating the need for channel counterdoping in the depletion mode transistor.

What has been described is an FET transistor in which operation is below the $T_c$ of a superconductor gate in the transistor.

Having thus described our invention, what we claim as new and desire to secure by letters patent is:

1. A transistor structure comprising in combination:
   at least one field effect semiconductor current carrying channel region,
      each said channel region having, positioned between source and drain electrodes,
      a single layer gate member of superconducting oxide superconducting material,
         each said single layer gate member being positioned directly on a gate insulator in contact with said channel region, and,
         each said single layer gate member having a longer dimension transverse to the distance of said channel region between said source and said drain electrodes than the width dimension of said gate member along the distance of said channel between said source and drain electrodes.

* * * * *